United States Patent
Yeh et al.

(10) Patent No.: US 11,833,558 B2
(45) Date of Patent: Dec. 5, 2023

(54) CLEANING METHOD AND EQUIPMENT THEREOF FOR OBJECT FOUP

(71) Applicant: ASIA NEO TECH INDUSTRIAL CO., LTD., Taoyuan (TW)

(72) Inventors: Pu Chang Yeh, Taoyuan (TW); Li Ta Yu, Taoyuan (TW)

(73) Assignee: ASIA NEO TECH INDUSTRIAL CO., LTD., Taoyuan (TW)

(*) Notice: Subject to any disclaimer, the term of this patent is extended or adjusted under 35 U.S.C. 154(b) by 95 days.

(21) Appl. No.: 17/341,146

(22) Filed: Jun. 7, 2021

(65) Prior Publication Data
US 2022/0331848 A1 Oct. 20, 2022

(30) Foreign Application Priority Data
Apr. 16, 2021 (TW) ................................. 110113716

(51) Int. Cl.
*B08B 9/093* (2006.01)
*B08B 5/02* (2006.01)
(Continued)

(52) U.S. Cl.
CPC .............. *B08B 9/093* (2013.01); *B08B 3/02* (2013.01); *B08B 5/023* (2013.01); *B08B 9/0821* (2013.01);
(Continued)

(58) Field of Classification Search
CPC ........... B08B 9/093; B08B 3/02; B08B 5/023; B08B 9/0821; B08B 13/00;
(Continued)

(56) References Cited

U.S. PATENT DOCUMENTS

2003/0051743 A1* 3/2003 Breese .............. H01L 21/67051
134/140
2012/0325271 A1 12/2012 Rebstock
(Continued)

FOREIGN PATENT DOCUMENTS

JP 2021027200 A * 2/2021
TW 201400202 A 1/2014
(Continued)

OTHER PUBLICATIONS

Machine Translation of JP2021027200A, Substrate Processing Apparatus (Year: 2021).*

*Primary Examiner* — Sharidan Carrillo
(74) *Attorney, Agent, or Firm* — Chun-Ming Shih; HDLS IPR SERVICES

(57) ABSTRACT

The present invention provides a cleaning method and equipment thereof for object FOUP, comprising the following steps: firstly separating the object FOUP into a container lid and a container body, then conducting individual processes of wet washing, liquid removing and vacuum drying for the container lid and container body, and in the end combining the container lid and container body to complete the cleaning procedure of the object FOUP; specifically, during the liquid removing process, multiple wind knives are used to carry out liquid removing for the container body, and during the vacuum drying process after liquid removing, multiple thermal components are used to carry out vacuum drying for the container body under a vacuum environment; moreover, the present invention also includes the cleaning equipment to execute the above method, for the purpose of overcoming the problem that the wet cleaning process in the conventional automatic chip FOUP cleaning technique cannot effectively clean object FOUPs with relatively complicated internal structures.

6 Claims, 12 Drawing Sheets

(51) Int. Cl.
*B08B 13/00* (2006.01)
*B08B 3/02* (2006.01)
*B08B 9/08* (2006.01)
*F26B 5/04* (2006.01)
*F26B 5/08* (2006.01)
*F26B 25/06* (2006.01)
*F26B 21/08* (2006.01)
*B25J 11/00* (2006.01)
*H01L 21/677* (2006.01)

(52) U.S. Cl.
CPC ........... *B08B 13/00* (2013.01); *B25J 11/0085* (2013.01); *F26B 5/04* (2013.01); *F26B 5/08* (2013.01); *F26B 21/08* (2013.01); *F26B 25/06* (2013.01); *B08B 2209/08* (2013.01); *H01L 21/6773* (2013.01)

(58) Field of Classification Search
CPC ..... B08B 2209/08; B25J 11/0085; F26B 5/08; F26B 21/08; F26B 25/06; H01L 21/6773
See application file for complete search history.

(56) References Cited

U.S. PATENT DOCUMENTS

| | | | |
|---|---|---|---|
| 2012/0328403 A1* | 12/2012 | Rebstock | B08B 3/12 414/730 |
| 2014/0069467 A1 | 3/2014 | Rebstock | |
| 2015/0090296 A1* | 4/2015 | Nagashima | B08B 3/10 134/95.2 |
| 2019/0247900 A1* | 8/2019 | Park | B08B 9/0826 |
| 2022/0152661 A1* | 5/2022 | Park | F26B 3/305 |

FOREIGN PATENT DOCUMENTS

| | | |
|---|---|---|
| WO | WO2004093147 A2 | 10/2004 |
| WO | WO2010146561 A1 | 12/2010 |

* cited by examiner

CLEANING METHOD AND EQUIPMENT THEREOF FOR OBJECT FOUP

BACKGROUND OF INVENTION

1. Field of the Invention

The present invention relates generally to a FOUP for loading and transferring articles between different processing zone stations, and more particularly to a cleaning method and equipment thereof for object FOUP.

2. Description of Related Art

Among the prior-art products, the one closest to the present invention is a Front Opening Unified Pod (FOUP) for loading and transferring semiconductor chips (hereinafter referred to as chip FOUP.

During the production of semiconductor chips, particularly in various processing zone stations and during transportation of chips between different processing zone stations, there is a high requirement for cleanness. Any foreign particles in the environment may cause defective chips.

It is known that semiconductor chips are normally loaded and transferred using the above-mentioned chip FOUP. Through the operation of an automatic transportation system, multiple chip FOUPs can respectively capture chips from different processing zone stations, hold them and transfer them between different processing zone stations, and finally unload the chips at the destination processing zone stations.

A chip FOUP is a combined structure comprising a releasable container lid and a container body. Inside the container body, the inner walls on both sides are provided with comb-like protruding ribs, used to support the chips held inside, so that multiple chips can be held inside each chip FOUP.

Due to the high-standard requirement for cleanness, the chip FOUPs must be automatically washed after a certain period of usage. At present, public advanced technologies for automatically washing the chip FOUPs can be found in such patents as CN102804332B, TW201400202A, CN1082222A, US20140069467A1 etc. According to those patents, the production line of chips is provided with a cleaning zone station, and an automatic transportation system is used to transfer the chip FOUP to be washed to a load port of the cleaning zone station. A robot in the cleaning zone station will automatically pick up the chip FOUP on the load port, firstly separate the container lid from the container body of the chip FOUP, and then hold the container lid and container body to pass through such sequential processes as wet washing in washing liquid, vacuum drying in vacuum environment, etc., so as to remove the particles possibly remaining on the inner or outer surfaces of the container lid or container body, and to consequently enhance the cleanness in the dust-free transportation system.

It is also known that chip FOUPs for dust free chip transportation have already been applied for transporting high-end IC carriers, such as IC carriers for Embedded Multi-Die Interconnect Bridge (EMIB) or IC carriers that use ABF as build-up material. The areas of such high-end IC carriers are relatively larger than traditional PCBs, and they are laid out in rectangular forms, so that the hardness of high-end IC carriers is less than the traditional PCBs. Therefore, when the article held inside the FORP is changed from chips to high-end IC carriers, the internal structure of the FORP must be altered to allow stable placement of multiple high-end IC carriers in each FORP.

FIG. 1 to FIG. 3 disclose the appearance of an existing object FOUP 10 for holding the above-mentioned high-end IC carrier 16 (hereinafter referred to as carrier 16). Its container body 11 and container lid 12 are the same as the chip FOUP, and in particular, inside the container body 11, the inner walls 11a on both sides are provided with comb-like protruding ribs 13. In addition, because the area of the carrier 16 as the article to be held is relatively larger and softer, the bottom 11b of the container body 11 must be formed with suspended support shafts 15 protruding from the bottom to the contain chamber 14, so that the ribs 13 on both sides can be used to support the two ends 16a of the carrier 16, and the suspended support shaft 15 can be used to hold the middle portion 16b of the carrier 16, to avoid collapse of the carriers 16 inside the object FOUP 10 or inference with each other (see details in FIG. 1, FIG. 2 and FIG. 3).

Therefore, the difference of articles to be held will affect the complexity of the internal structure of the container body. Specifically, in the case of object FOUP 10 for transporting carriers, the inside of the container body 11 is provided with comb-like ribs 13 and suspended support shafts 15, the overall structure is more complicated than the container body for transporting chip FOUPs.

Thus, when cleaning the container body of FOUPs with complicated internal structures (such as the container body for transporting carriers), the above-mentioned public FOUP cleaning technologies are not ideal. For example, the wet washing and vacuum drying technology disclosed in CN102804332B is a recent technique, which includes the following steps:

1. Multiple liquid nozzles and air nozzles are provided in the same chamber for wet washing. Firstly, the liquid nozzles are used to spray and wash the container body, and then the air nozzles provided inside the chamber are used to blow and remove the liquid residues on the inner and outer surface of the container body. However, no matter such liquid nozzles and air nozzles are fixed or in a rotary state, they will drag the protruding suspended support shaft inside the container body within the same chamber, and reduce the overall wet washing and liquid removing efficiency in the whole cleaning process. Moreover, capturing and placing the container body with complicated internal structures may become difficult inside the wet washing chamber.

2. Vacuum drying can be carried out along with wet washing in the same chamber or in different chambers. However, as the infrared heaters used for vacuum drying are not designed according to the container body with troughs and ribs to match the suspended support shaft or complicated internal structure, dragging may also happen to reduce the drying efficiency.

3. The process of vacuum drying is disclosed only conceptually. A humidity sensor can be used to monitor the drying process and control the result. However, there are no descriptions on how the humidity sensors inside the vacuum drying chamber or at other locations monitor the humidity of the washed and dried FOUPs.

To summarize, the existing techniques for automatically cleaning chip FOUPs cannot be effectively applied to clean object FOUPs of different styles with complicated internal structures, particularly object FOUPs inside the container body with suspended support shafts protruding into the contain chamber of the container. Therefore, further researches and innovations are needed to improve the design.

SUMMARY OF THE INVENTION

The object of the present invention is to improve the existing technology for automatically cleaning chip FOUPs, particularly object FOUP with relatively complicated internal structure of the container body, and to develop a technique to improve the wet washing and vacuum drying efficiency.

The present invention specifically improves the automatic cleaning process for conventional chip FOUPs, and divides the whole cleaning process into a wet washing process, a liquid removing process and a vacuum drying process; for this purpose, one embodiment of the invention discloses an object FOUP cleaning method, which can be used for automatic cleaning of chip FOUPs or FOUPs containing IC carriers (hereinafter referred to as carriers) made of EMIB or ABF build-up materials. In particular, the object FOUP cleaning method disclosed in the invention is implemented in cleaning processing zone stations. Said cleaning method includes: firstly, separating the object FOUP into a container lid and a container body, said container body having an opening, then, conducting sequential processes of wet washing, liquid removing and vacuum drying for the container lid and container body, and finally, combining the container lid and the container body, wherein, said wet washing, liquid removing and vacuum drying processes of the container body are respectively carried out in multiple different chambers, said multiple different chambers are distributed around the cleaning processing zone stations, including: at least one container body washing chamber for wet washing, at least one container body liquid removing chamber for liquid removing and at least one container body vacuum drying chamber for vacuum drying, wherein: said container body undergoes liquid removing inside the container body liquid removing chamber in a rotary mode, inside the container body liquid removing chamber, multiple wind knives are provided to generate linear wind in different axial directions and in planar distributions, and to conduct liquid removing for the inner surfaces and outer surfaces of the container body at close distances; and said container body vacuum drying chamber uses multiple thermal components (such as electric heating tiles or infrared heaters) in a vacuum environment to carry out liquid removing for the inner surfaces and outer surfaces of the container body.

In a further embodiment, a load port is distributed around the cleaning processing zone station. Said load port is provided for placement of the object FOUPs before separation of the container lid and the container body. Said load port is also provided for the object FOUP moving process. The moving process includes turning the direction of the object FOUP.

In a further embodiment, the linear wind provided by the multiple wind knives is hot air to heat the container body before vacuum drying.

In a further embodiment, the bottom of the container body is protruded with at least one suspended support shaft, and the inner surface of the container body includes the peripheral surface of the suspended support shaft.

In a further embodiment, the invention also includes a humidity detecting process. The humidity detecting process is carried out after the combination of the container lid and the container body, including: the load port providing clean dry air into the object FOUP to generate positive-pressure dry air; said load port provides a multi-pass tube to capture the positive-pressure dry air, and the multi-pass tube provides a humidity sensor to detect the humidity of the positive-pressure dry air.

In a further embodiment, the multi-pass tube also provides a particle counter, used to detect the amount of dust in the positive-pressure dry air.

In a further embodiment, the bottom of the container body is protruded with at least one suspended support shaft, and the inner surface of the container body includes the peripheral surface of the suspended support shaft.

In a further embodiment, the invention also includes a humidity detecting process. Said humidity detecting process is carried out during the container body vacuum drying process, including: after completion of the container body vacuum drying process inside the container body vacuum drying chamber, dry air is introduced into the container body vacuum drying chamber to release the vacuum condition, and then positive-pressure dry air is generated inside the container body vacuum drying chamber. Said container body vacuum drying chamber also provides a multi-pass tube, used to capture the positive-pressure dry air, and the multi-pass tube provides a humidity sensor, used to detect the humidity of the positive-pressure dry air.

In a further embodiment, said multi-pass tube also provides a particle counter, used to detect the amount of dust in the positive-pressure dry air.

In a further embodiment, the bottom of the container body is protruded with at least one suspended support shaft, and the inner surface of the container body includes the peripheral surface of the suspended support shaft.

Moreover, another embodiment of the present invention discloses a set of object FOUP cleaning equipment, which includes: a robot, installed in the cleaning processing zone station, to capture the object FOUP and separates it into a container lid and a container body, the container body has an opening, the periphery of the cleaning processing zone station is provided with: at least one container lid cleaning chamber, the robot captures the container lid and place it inside said at least one container lid cleaning chamber, to carry out wet washing, liquid removing and vacuum drying sequentially; at least one container body washing chamber, with built-in multiple liquid nozzles, the robot captures the container body, puts the opening downward inside said at least one container body washing chamber, said multiple liquid nozzles can be distributed around the outer surface and inner surface of the container body and spray washing liquid, so as to carry out wet washing for the container body; at least one container body liquid removing chamber, with a built-in turntable and multiple wind knives to provide linear wind in different axial directions and in planar distributions; the turntable is made of a hollow checkerboard frame, and is located close to the bottom of said container body liquid removing chamber, the robot captures the container body inside said at least one container body washing chamber, puts the opening downward on the turntable; said multiple wind knives include a bottom wind knife and a side wind knife, the bottom wind knife is provided across the bottom of the turntable, the side wind knife is vertically configured on one side of the inner wall of said container body liquid removing chamber, and the linear wind provided by the bottom wind knife can blow the inner surface of the container body through the opening, the linear wind provided by the side wind knife can blow the outer surface of the container body; wherein, the turntable can drive the container body to rotate and receive the linear wind provided by the bottom wind knife and the side wind knife respectively in different axial directions and in planar distributions, so as to carry out liquid removing for the container body; at least one container body vacuum drying chamber, configured with an exhaust hole and multiple thermal components, the exhaust hole is used to capture the air inside said container body vacuum drying chamber to generate native pressure, the robot captures the container body inside said at least one container body liquid removing chamber, puts the opening downward on the bottom of said container body vacuum drying chamber; said multiple thermal components can be distributed around the outer surface and inner surface of the container body in close distances to generate heat radiation, so as to carry out vacuum drying for the container body.

In another embodiment, said multiple thermal components include multiple vertical electric hot plates, said multiple vertical electric hot plates are vertically configured inside said container body vacuum drying chamber and can be planted into the contain chamber of the container body, and can generate heat radiation to heat the inner surface of the container body in close distance. In addition, said multiple thermal components also include multiple wall-type electric hot plates, respectively adhered to the peripheral walls of the container body vacuum drying chamber, capable of generating heat radiation to heat the outer surface of the container body.

In a further embodiment, a load port is installed around the cleaning processing zone station, the load port includes a platform for placement of the object FOUP, the platform is configured with at least one linear driver to move the object FOUP, and a rotating device to turn the direction of the object FOUP, the robot captures the object FOUP from the platform and separates it into said container lid and said container body, the robot also captures said container body with completion of vacuum drying inside said at least one container body vacuum drying chamber and said container lid with completion of cleaning inside said at least one container lid cleaning chamber, and combine said container body and said container lid and place it on the platform.

In a further embodiment, the platform of the load port is installed with: an air inlet nozzle to introduce clean positive-pressure dry air into the object FOUP, and an air discharge nozzle to discharge positive-pressure dry air from the object FOUP, the air discharge nozzle is connected to a multi-pass tube, the multi-pass tube is connected to a humidity sensor, through the multi-pass tube, the humidity sensor can detect the humidity of the positive-pressure dry air discharged from the object FOUP.

In a further embodiment, the multi-pass tube is also connected to a particle counter, through the multi-pass tube, and the particle counter can detect the amount of dust in the positive-pressure dry air discharged from the object FOUP.

In a further embodiment, said at least one container body vacuum drying chamber is also configured with an air inlet, the air inlet can introduce clean dry air into said container body vacuum drying chamber to release the vacuum condition and generate positive-pressure dry air, the exhaust hole is connected to a multi-pass tube, the multi-pass tube is connected to a humidity sensor, through the multi-pass tube, the humidity sensor can detect the humidity of the positive-pressure dry air discharged from said container body vacuum drying chamber via the exhaust hole.

In a further embodiment, the multi-pass tube is also connected to a particle counter, through the multi-pass tube, and the particle counter can detect the amount of dust in the positive-pressure dry air discharged from said container body vacuum drying chamber.

In a further embodiment, said multiple wind knives is connected to a wind pressure supplier, the wind pressure supplier is configured with an electric heater.

In a further embodiment, the bottom of the container body is protruded with at least one suspended support shaft, and the inner surface of the container body includes the peripheral surface of the suspended support shaft.

The technology disclosed in the present invention can automatically clean object FOUPs with complicated internal structure of the container body (such as carrier FOUPs). It can also be applied for automatically cleaning chip FOUPs. This is clearly indicated in the present invention.

The features and technical effects disclosed in the various embodiments are presented in the following descriptions and figures.

DETAILED DESCRIPTION OF THE INVENTION

In the following descriptions of patent embodiments, the term "cleaning" has a wider meaning than "washing", and includes processes of "wet washing (or washing), liquid removing and vacuum drying"; moreover, it is to be noted that "cleaning" can also include the "humidity detecting" process.

Figure 4A:
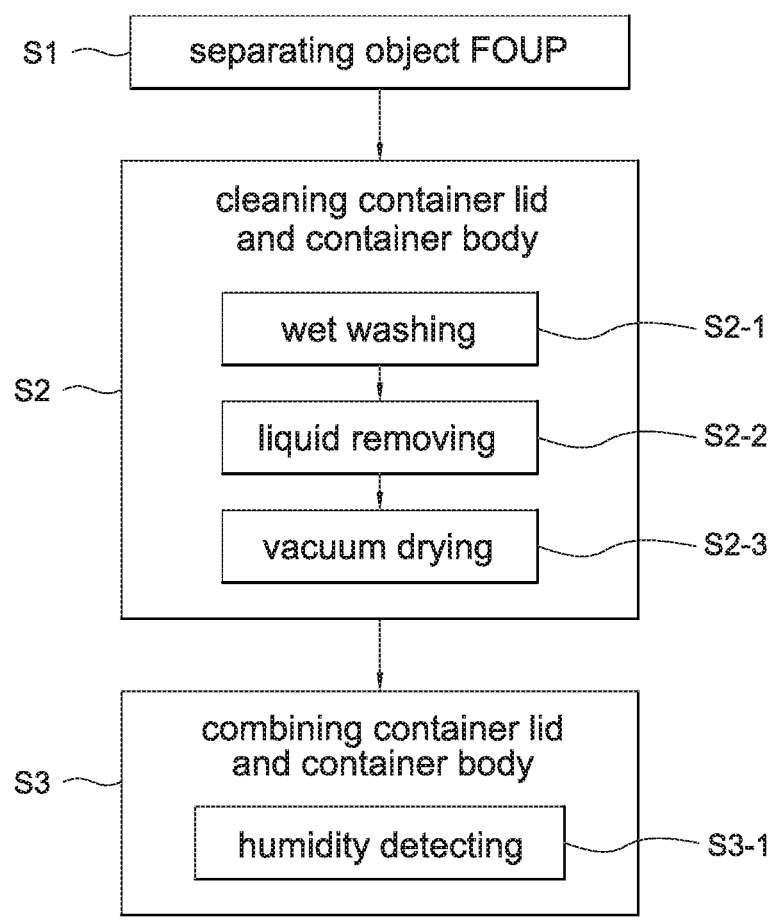
FIG. 4*a* is a step-by-step flow chart of the first embodiment of the cleaning method according to the invention.
Figure 5:
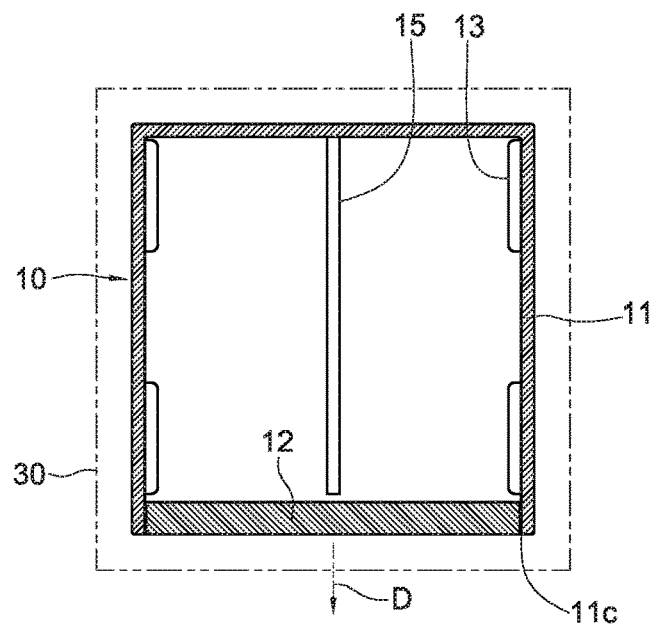
FIG. 5 to FIG. 10 are sequential operational views of the cleaning method according to the invention.
Figure 6:
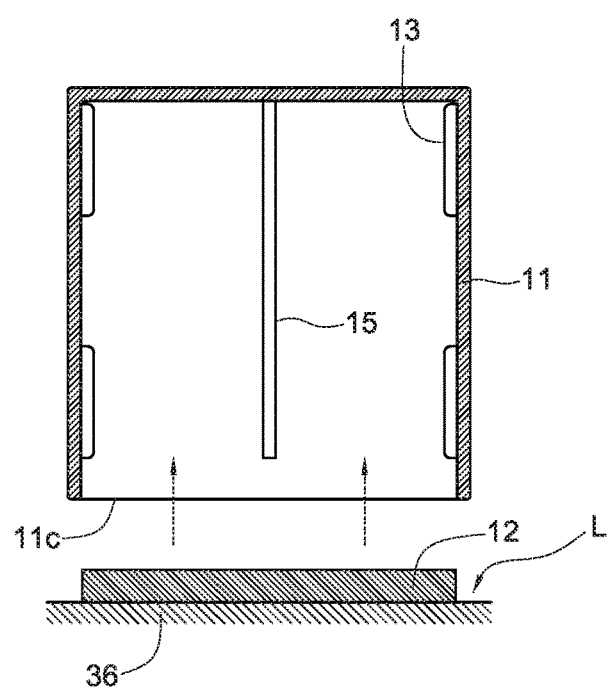
Figure 13:
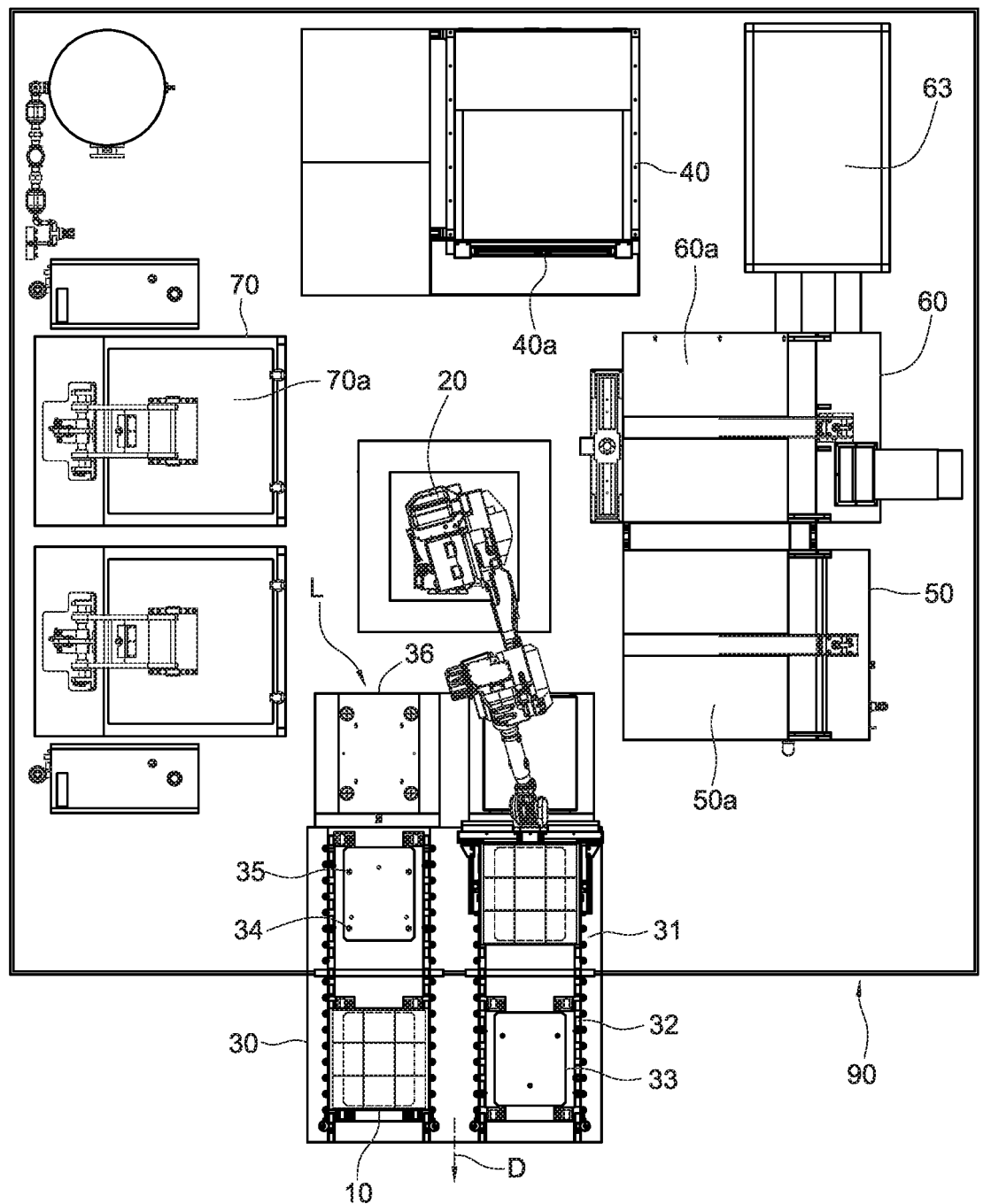
FIG. 13 is the configuration view of the cleaning equipment according to the invention.

FIG. 4*a* illustrates the object FOUP cleaning method of the invention implemented in cleaning processing zone stations 90 (see FIG. 13). In actual application, the cleaning processing zone station 90 can be a polygonal zone enclosed by chambers or equipment for washing (i.e., wet washing), liquid removing and vacuum drying of the object FOUP 10. Moreover, inside the cleaning processing zone station 90, a robot 20 (see FIG. 13) is configured to capture, move, separate, release and assemble the object FOUP 10, in order to execute the cleaning method disclosed in the invention. The cleaning method includes the following steps from S1 to S3:

Step S1: Separating the Object FOUP:

Referring to FIG. 5 to FIG. 6, an object FOUP 10 combined by a container body 11 and a container lid 12 is firstly transferred to a load port 30 by a device around the cleaning processing zone station 90. The load port 30 can lift, move and transport the object FOUP 10 to turn directions (for example 180 degrees), so that the object FOUP 10 with its container lid 12 not open will face its opening 11*c* of the container body 11 after opening-up toward a preset direction D (see FIG. 5). In the present embodiment, the preset direction D is to face the opening 11*c* away from the position of the robot 20 inside the cleaning processing zone station 90 (see FIG. 13). In other words, the preset direction D is to face the opening 11*c* toward the installation position of the load port 30 with the robot 20 as the center point. The aim is to facilitate easy separation of the container lid 12 from the container body 11, and easy combination after the robot 20 captures the object FOUP 10 (i.e., for easy execution to open and close the lid), and make the opening 11*c* of the container body 11 after opening of the lid exposed outside to be easily placed in the washing, liquid removing, and vacuum drying chambers (to be detailed later).

Moreover, the load port 30 can also move the object FOUP 10 after direction turning to a position that is easy for the robot 20 to capture; then, the robot 20 clamps the two side walls of the container body 11 to capture the whole object FOUP 10 on the load port 30, and then, the robot 20 moves the whole object FOUP 10 to a lid-opening position L (see FIG. 13) inside the cleaning processing zone station 90 close to the load port 30; in the present embodiment, the lid-opening position L is located on a side wall 36 of the load port 30 inside the cleaning processing zone station 90, the side wall 36 is configured with a fastener specifically provided for the container lid 12 and a lid-opening key (not shown in the figure). The fastener can be implemented as an absorbing disc or other components like flexible hooks etc. And the container lid 12 is already configured with a key hole (not shown in the figure) corresponding to the lid-opening key; When the robot 20 captures and moves the object FOUP 10 after direction turning, the preset opening 11*c* position (i.e., the position to assemble the container lid 12) of the container body 11 just faces toward the direction of the side wall 36, and the container lid 12 can contact the fastener on the side wall 36, and the fastener on the side wall 36 can absorb or clamp the container lid 12 on the container body 11. Now, the lid-opening key on the side wall 36 can be planted into the key hole of the container lid 12, the lid-opening key rotates to release the locked state between the container lid 12 and the container body 11 realized through a latch. Subsequently, the robot 20 clamping the container body 11 will move backward to complete the lid-opening action. In the end, the robot 20 moves the container body 11 away from the container lid 12, so that the opening 11*c* of the container body 11 is exposed (see FIG. 6).

Step S2: Cleaning the Container Lid and the Container Body:

Referring to FIG. 13, in implementation, Step S2 is to carry out sequential processes of wet washing, liquid removing and vacuum drying in the cleaning processing zone station 90 for the container lid 12 and the container body 11. Specifically, as the structure of the peripheral surfaces of the container lid 12 is not very complicated, said wet washing, liquid removing and vacuum drying processes for the container lid 12 can be carried out altogether in the at least one container lid cleaning chamber 40, including using two or more than two container lid cleaning chambers 40 to respectively carry out said wet washing, liquid removing and vacuum drying processes for the container lid 12; when there are two container lid cleaning chambers 40, the wet washing and liquid removing processes for the container lid 12 can be carried out in the same chamber, and the vacuum drying process for the container lid 12 can be carried out in another chamber. Said wet washing, liquid removing and vacuum drying processes for the container body 11 are respectively carried out in multiple different chambers; In implementation, said container lid cleaning chamber 40 and said multiple different chambers are distributed around the cleaning processing zone station 90; In implementation, said multiple different chambers include at least one container body washing chamber 50 for wet washing, at least one container body liquid removing chamber 60 for liquid removing, and at least one container body vacuum drying chamber 70 for vacuum drying. In addition, in implementation, the container body 11 is put into said container body washing chamber 50, said container body liquid removing chamber 60 and said container body vacuum drying chamber 70 with the opening 11*c* facing downward; wherein, as the robot 20 can expose the opening 11*c* during movement of the container body 11, during the processes of said wet washing, liquid removing and vacuum drying for the container body 11, the robot 20 can put the container body 11 into said multiple different chambers with the opening 11*c* facing downward (i.e., the same direction as the force of gravity), so that, during the wet washing, liquid removing and vacuum drying processes for the container body 11, the washing liquid remained on the inner surface 11*f* of the container body 11 can be attracted by the force of gravity and go smoothly away from the container body 11 through the opening 11*c*, and will no longer remain on the inner surface 11*f* of the container body 11.

Figure 7:
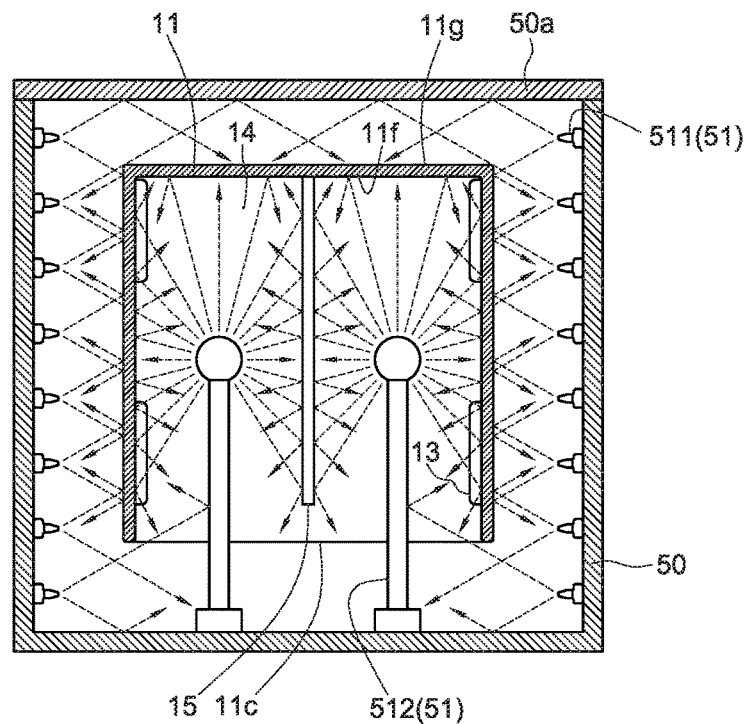

Referring to FIG. 7, the wet washing process for the container body 11 is carried out in said container body washing chamber 50, including using multiple liquid nozzles 51 inside said container body washing chamber 50 to spray washing liquid on the inner surface 11*f* and outer surface 11*g* of the container body 11 to carry out said wet washing process. Specifically, said multiple liquid nozzles 51 include multiple wall nozzles 511 distributed on the peripheral inner walls of the container body washing chamber 50, and multiple rotary liquid nozzles 512 that can be planted into the contain chamber 14 of the container body 11; said multiple wall nozzles 511 can spray washing liquid to wash the peripheral outer surface 11*f* of the container body 11, and said multiple rotary liquid nozzles 512 can rotate in 360 degrees and spray washing liquid on the peripheral inner surface 11*f* of the container body 11. In addition, in implementation, the inner surface 11*f* of the container body 11 also includes the peripheral surfaces of ribs 13 and suspended support shaft 15 configured inside the container body 11; therefore, specifically, said multiple rotary liquid nozzles 512 can spray washing liquid on the peripheral surfaces of the comb-like ribs 13 and the suspended support shaft 15 in a 360-degree rotary mode, so that the dust remained on the come-like ribs 13 and suspended support shaft 15 can receive washing liquid from different angles, and be thoroughly flushed to go away from said inner surface 11*f*.

Figure 8:
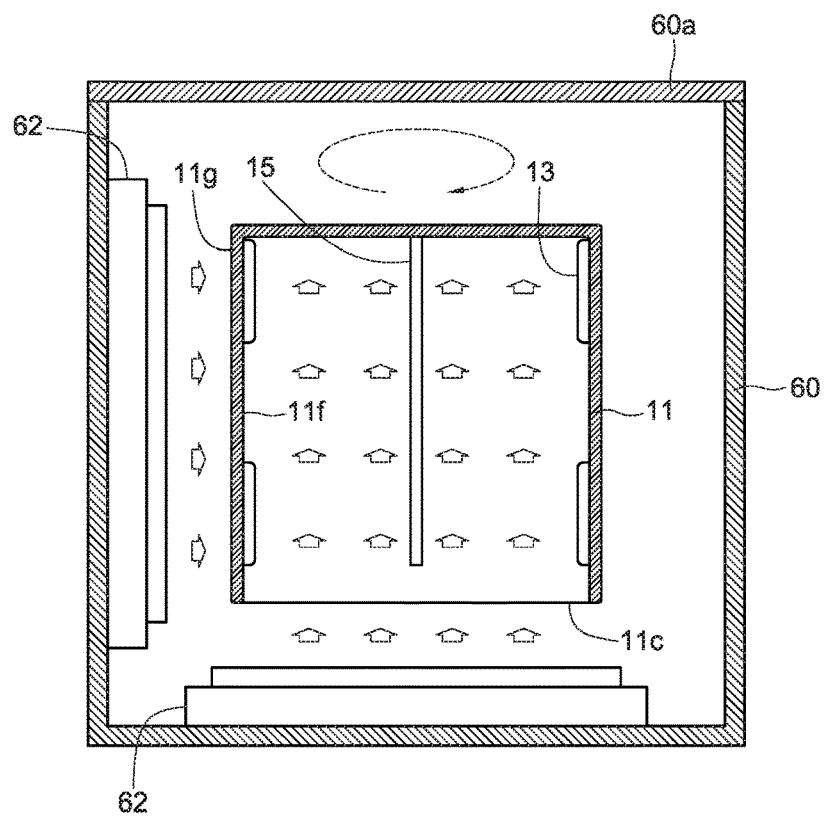

Referring to FIG. 8, said liquid removing process for the container body 11 is carried out inside said container body liquid removing chamber 60, and the container body 11 receives the liquid removing process inside said container body liquid removing chamber 60 in a rotary mode; said rotary mode refers to the implementation of speed-changing self rotation including forward and backward rotations to realize the effect of liquid removing for the container body 11 as expected by the control end. Furthermore, inside the container body liquid removing chamber 60, multiple wind knives are used to provide linear wind in different axial directions and in planar distributions 62. The present invention specifically uses the linear wind in different axial directions and in planar distributions provided by the wind knives 62. Said linear wind in different axial directions can thoroughly remove the washing liquid beads remained on the inner surface 11$f$ and outer surface 11$g$ of the container body 11, so as to enhance the effect of liquid removing for the container body 11.

In a further embodiment, said linear wind provided by the wind knives 62 can be generated by using a blower to drive dry air. The dry air is firstly filtered and heated, so that the wind knives 62 can provide clean and hot linear wind to blow the inner surface 11$f$ and outer surface 11$g$ of the container body 11. Thus, as the linear wind provided by said wind knives 62 is hot wind, during the whole liquid removing process, it can not only accelerate the evaporation of the washing liquid residues on the inner surface 11$f$ and outer surface 11$g$ on the container body 11, but also preheat the container body 11 to enhance the drying effect for the container body 11 in the subsequent vacuum drying process (to be detailed later).

Figure 9:
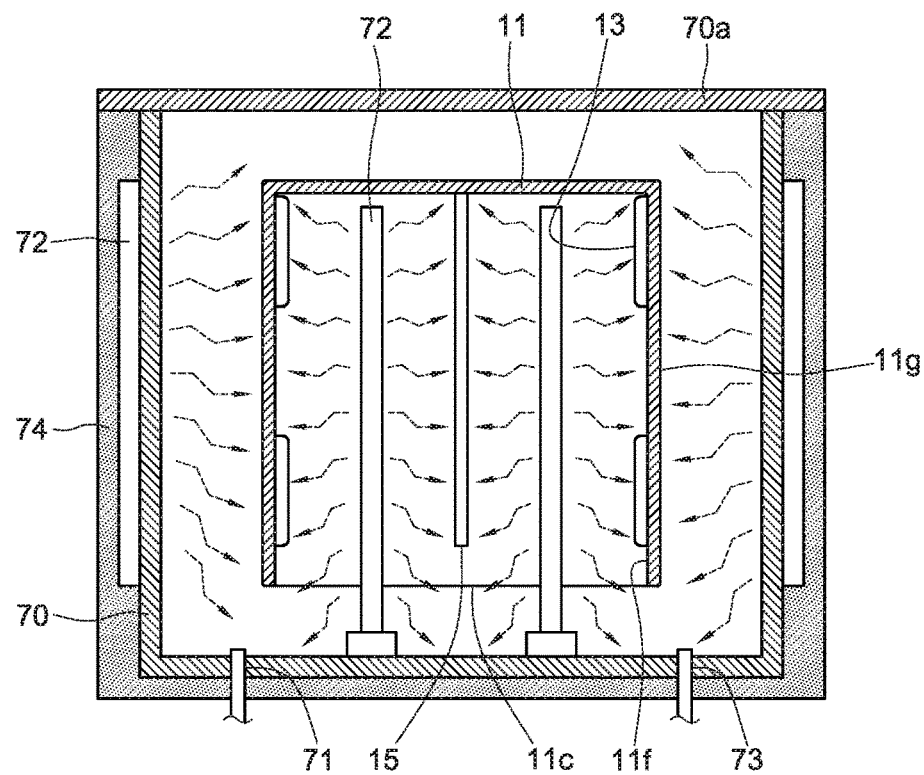

Referring to FIG. 9, the container body 11 vacuum drying process is carried out in the container body vacuum drying chamber 70; in implementation, the internal space of said container body vacuum drying chamber 70 must be a space capable of forming a vacuum environment, and there are multiple thermal components 72. In a preferred embodiment, said thermal components 72 can be planar electric hot plates, so that, when the container body 11 is planted into the container body vacuum drying chamber 70, the multiple planar electric hot plates can be distributed around the inner surface 11$f$ and outer surface 11$g$ of the container body 11, so as to carry out the vacuum drying process for the inner surface 11$f$ and outer surface 11$g$ of the container body 11 after execution of the liquid removing process. In addition, the multiple thermal components 72 can also be infrared heaters, but the effect is not good, so it is not detailed herein.

It is to be noted that, after the container body 11 receives hot-air linear wind from the wind knives 62 in the liquid removing process to complete the liquid removing process, the container body 11 itself has a preheated temperature higher than the normal temperatures and lower than the boiling point of water. This preheated temperature can cause the water remained on the inner surface and outer surface 11$f$, 11$g$ of the container body 11 to be preheated together. Therefore, when the container body 11 is subsequently planted into the container body vacuum drying chamber 70 for the vacuum drying process, in the vacuum chamber environment (lower than 1 atm), the boiling point of the water remained on the inner surface and outer surface 11$f$, 11$g$ of the container body 11, will not be instantly reduced under the influence of the vacuum pressure or the water be instantly frozen. Thus, in the vacuum environment of the negative-pressure chamber, and under the heating by the heat radiation generated by the thermal components 72, the water remained on the inner surface and outer surface 11$f$, 11$g$ of the container body 11 can be quickly heated to the boiling point, and be evaporated to leave the inner surface and outer surface 11$f$, 11$g$ of the container body 11, so as to shorten the time of the vacuum drying process for the container body 11.

Figure 10:
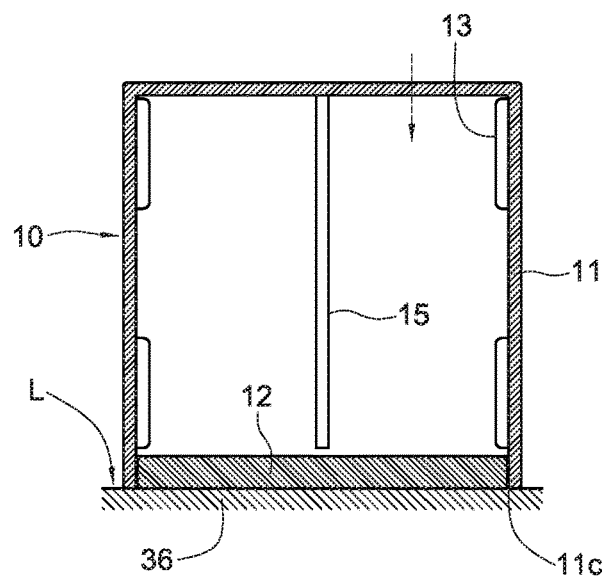

Step S3: Combining Container Lid and Container Body:

Referring to FIG. 10, after completion of said wet washing, liquid removing and vacuum drying processes, the container lid 12 is placed on the side wall 36. The above-said side wall 36 used as the lid-opening position L can also be used as a lid-closing position. More specifically speaking, when the wet washing, liquid removing and vacuum drying processes of said container lid 12 and container body 11 are respectively completed, they are also be transported by the robot 20 and be combined into a whole object FOUP 10 at the lid-opening position L (i.e., lid-closing position); in implementation, there can be one or multiple load port 30, and is configured at or close to at least one end of the cleaning processing zone station 90, to act as the window for the object FOUP 10 to be washed to go into the cleaning processing zone station 90. Meanwhile, the load port 30 is also used as the window for the washed object FOUP 10 to leave the cleaning processing zone station 90 (see FIG. 13).

Figure 4B:
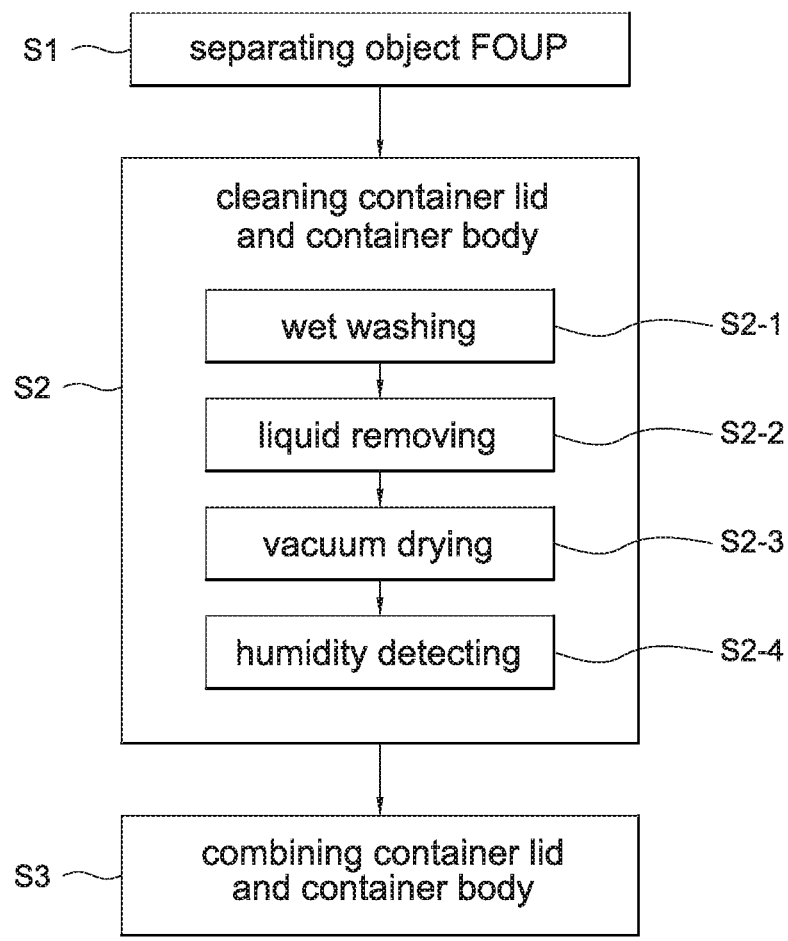
FIG. 4*b* is a step-by-step flow chart of the second embodiment of the cleaning method according to the invention.
Figure 11:
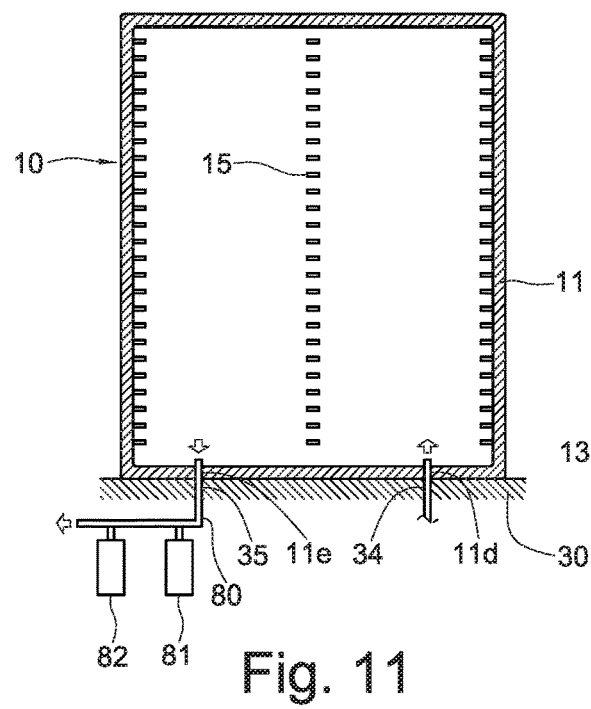
FIG. 11 is the operational view of the humidity detecting process in FIG. 4*a*.

Referring to FIG. 4$a$ and FIG. 11 together, the cleaning method includes a humidity detecting process.

The first embodiment of the humidity detecting process is conducted after combination of the container lid 12 and the container body 11; more particularly, the humidity detecting process is carried out in the load port 30. After the container lid 12 and the container body 11 are combined into the object FOUP 10 at the lid-opening position L, the internal space of the object FOUP 10 is formed as a closed space. Then, the object FOUP 10 is moved to the load port 30. The load port 30 introduces clean dry air into the object FOUP 10, so that a positive-pressure of dry air is formed inside the object FOUP 10, i.e., the air pressure inside the object FOUP 10 is larger than the outside air pressure. The load port 30 also provides a multi-pass tube 80. The positive-pressure dry air inside the object FOUP 10 can leave the object FOUP 10 through the multi-pass tube 80. The multi-pass tube 80 provides a humidity sensor 81 to detect the humidity of the positive-pressure dry air and a particle counter 82 to detect the amount of dust in the positive-pressure dry air. In this way, the humidity and cleanness inside the object FOUP 10 can be detected.

Figure 12:
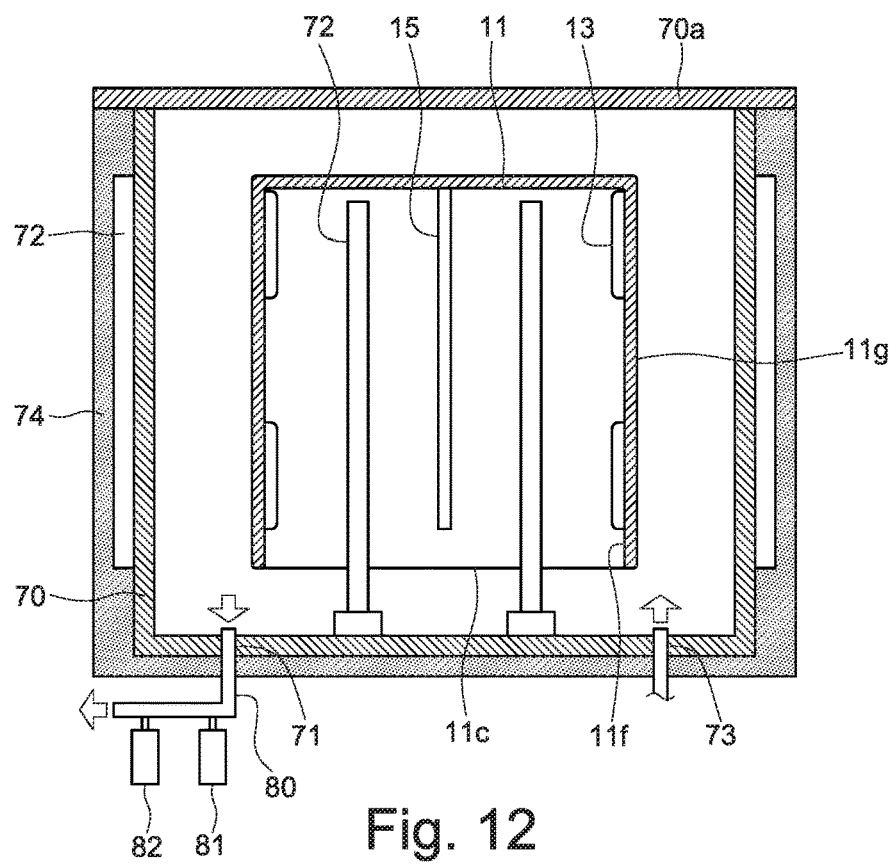
FIG. 12 is the operational view of the humidity detecting process in FIG. 4*b*.

Referring jointly to FIG. 4$b$ and FIG. 12, the second embodiment of the humidity detecting process is carried out in the vacuum drying process for the container body 11. After completion of the vacuum drying process of the container body 11 inside said container body vacuum drying chamber 70, clean dry air is introduced into said container body vacuum drying chamber 70, to release the vacuum state inside said container body vacuum drying chamber 70 (i.e., to break the vacuum), so that a positive-pressure of dry air is formed inside said container body vacuum drying chamber 70, i.e., the air pressure inside said container body vacuum drying chamber 70 is larger than the outside air pressure. Said container body vacuum drying chamber 70 provides a multi-pass tube 80, so that the positive-pressure dry air inside said container body vacuum drying chamber 70 can go through the multi-pass tube 80 and leave said container body vacuum drying chamber 70. The multi-pass tube 80 provides a humidity sensor 81 to detect the humidity of the positive-pressure dry air and a particle counter 82 to detect the positive-pressure dry air. Thus, the humidity and cleanness inside said container body vacuum drying chamber 70 can be monitored, so as to know the humidity and cleanness inside the container body 11.

On the other hand, further referring to FIG. 13, the present invention also provides cleaning equipment for the object FOUP to facilitate the above-said object FOUP cleaning method.

The object FOUP cleaning equipment is built inside the cleaning processing zone station 90. The cleaning equipment includes the robot 20, at least one load port 30, at least one container lid cleaning chamber 40, at least one container body washing chamber 50, at least one container body liquid removing chamber 60 and at least one container body vacuum drying chamber 70, wherein:

The robot 20 is installed inside the cleaning processing zone station 90. The load port 30, the container lid cleaning chamber 40, the container body washing chamber 50, the container body liquid removing chamber 60 and the container body vacuum drying chamber 70 are respectively distributed around the robot 20. The robot 20 can move the object FOUP 10 on the load port 30 to be close to the lid-opening position L of the load port 30. In the present embodiment, the lid-opening position L is located on the side wall 36 of the load port 30. The object FOUP 10 can be separated into the container lid 12 and the container body 11 at the lid-opening position L. Also, the container lid 12 and the container body 11 can be combined into the object FOUP 10 at the lid-opening position L, and be moved to the load port 30. The container lid 12 can be captured by the robot 20 and be moved to the lid-opening position L and said container lid cleaning chamber 40, the container body 11 can be captured by the robot 20 and be moved to the lid-opening position L, said container body washing chamber 50, said container body liquid removing chamber 60 and said container body vacuum drying chamber 70.

Figure 14:
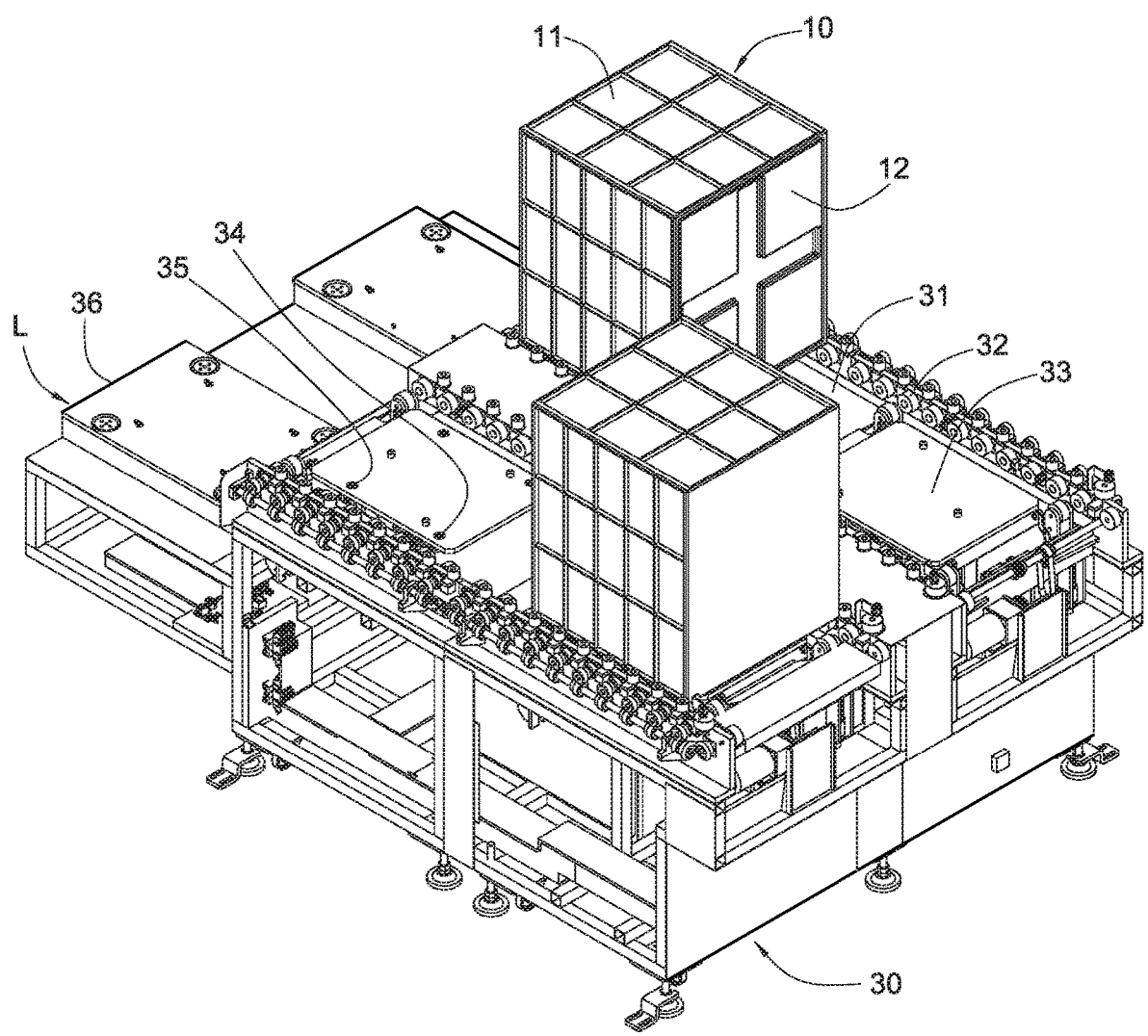
FIG. 14 is a perspective view of the load port in FIG. 13.

Referring jointly to FIG. 13 and FIG. 14, the load port 30 includes a platform 31 for placement of the object FOUP 10. The platform 31 is provided with at least one linear driver 32 to move the object FOUP 10. The object FOUP 10 moves on the platform 31 under the drive by the linear driver 32. In implementation, said linear driver 32 can be multiple rollers distributed on the platform 31 with correspondence to each other. Each of the rollers can rotate simultaneously under the drive by the motor, and can drive the object FOUP 10 to move; the platform 31 is also provided with a rotating device 33 to drive the object FOUP 10 to adjust the direction of the opening 11c of the container body 11. The rotating device 33 is located below the linear driver 32. When the object FOUP 10 is driven by the linear driver 32 to move to a position above the rotating device 33, the rotating device 33 will rise and life the object FOUP 10 to leave the linear driver 32. Then, the object FOUP 10 is driven by the rotating device 33 to face the opening 11c of the container body 11 away from the robot 20 (i.e., facing toward the preset direction D). Then, the rotating device 33 will descend to place the object FOUP 10 after direction turning on the linear driver 32. In the end, the robot 20 captures the object FOUP 10 after direction turning, move the object FOUP 10 to a position close to the lid-opening position L of the load port 30. The object FOUP 10 is separated into the container lid 12 and the container body 11 at the lid-opening position L; Or, the robot 20 captures the container body 11 in the container body vacuum drying chamber 70 after vacuum drying and the container lid 12 inside the container lid cleaning chamber 40 after cleaning, and combine the container body 11 and the container lid 12 at the lid-opening position L into the object FOUP 10 and place it on the platform 31.

Comparing to the container body 11, as the concave or convex structures on the periphery of the container lid 12 are not so complicated, there is no need to carry out the wet washing, liquid removing and vacuum drying processes in different chambers. Therefore, further referring to FIG. 13, in implementation, said container lid cleaning chamber 40 can be designed into a two-storey chamber with one single flooring area. Each storey of the container lid cleaning chamber 40 is provided with a cover board 40a that can be turned open; wherein, the lower-storey chamber can be used to install structures for wet washing of the container lid 12 and for liquid removing of the rotary container lid (refer to the structure of the container body washing chamber 50 and the container body liquid removing chamber 60), and the upper chamber can be used to install the structures for the vacuum drying container lid 12 (refer to the structure of the container body vacuum drying chamber 70). Thus, the cover board 40a of said container lid cleaning chamber 40 can be turned open so that said container lid cleaning chamber 40 is communicated with the outside, and the robot 20 can place the container lid 12 into the container lid cleaning chamber 40, to carry out the wet washing, liquid removing and vacuum drying processes for the container lid all at once or one by one, and then can capture the container lid 12 after completion of the wet washing, liquid removing and vacuum drying from the container lid cleaning chamber 40; on the contrary, when the cover board 40a is closed, the inner space of the container lid cleaning chamber 40 forms a closed space to facilitate wet washing, liquid removing and vacuum drying processes for the container lid 12 inside the container lid cleaning chamber 40.

Further referring to FIG. 13, said container body washing chamber 50 is configured with multiple liquid nozzles 51 (see FIG. 7), include multiple wall nozzles 511 configured on the peripheral inner wall of the container body washing chamber 50, and multiple rotary liquid nozzles 512 that can be planted into the contain chamber 14 of the container body 11; when the robot 20 captures the container body 11, and places the container body 11 into said container body washing chamber 50 with its opening 11c facing downward, said multiple wall nozzles 511 can spray washing liquid to flush the peripheral outer surface 11f of the container body 11, and said multiple rotary liquid nozzles 512 can spray the peripheral inner surface 11f of the container body 11 with 360-degree rotations, so that the wet washing process of the container body 11 can be carried out smoothly inside the container body washing chamber 50; wherein, during the wet washing process of the container body 11, as the opening 11c of the container body 11 is maintained to be facing downward, during the wet washing processes of the container body 11, washing liquid can directly leave the container body 11 through the opening 11c at the bottom and will not remain inside the container body 11. In implementation, said container body washing chamber 50 can be provided with a cover board 50a that can be turned open. When the cover board 50a is turned open, the container body washing chamber 50 is communicated to the outside, and the robot 20 can place the container body 11 needing wet washing into the container body washing chamber 50, or can capture the container body 11 inside the container body washing chamber 50 that has completed the wet washing process; on the contrary, when the cover board 50a is closed, the inner space of said container body washing chamber 50 forms a closed space to facilitate the wet washing process for the container body 11 inside said container body washing chamber 50, while avoiding spattering of the washing liquid out of the container body washing chamber 50 during the wet washing process of the container body 11.

Figure 15:
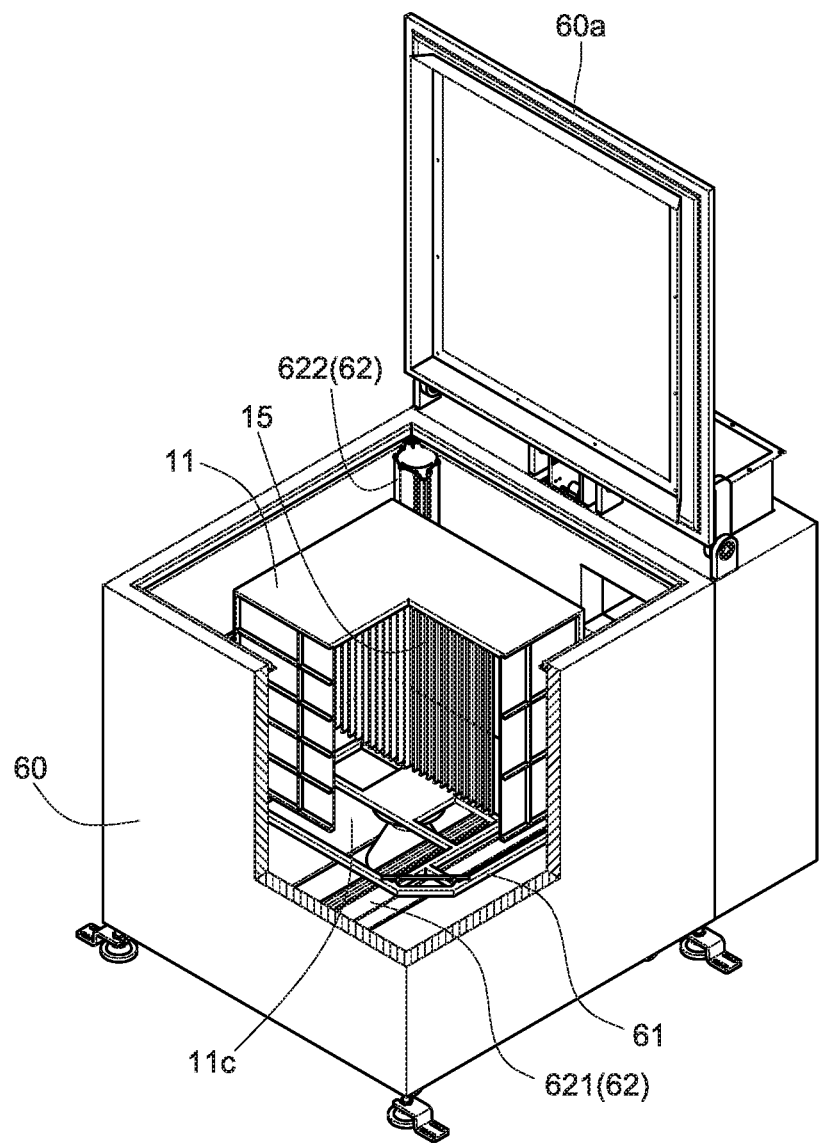
FIG. 15 is a perspective view of the container body washing chamber in FIG. 13.

Referring jointly to FIG. 13 and FIG. 15, said container body liquid removing chamber 60 is configured with a turntable 61 and multiple wind knives to provide linear wind in different axial directions and in planar distributions 62, wherein the turntable 61 is made of a hollow checkerboard frame, and is located close to the bottom of said container body liquid removing chamber 60. The robot 20 captures the container body 11 inside said container body washing chamber 50 that has completed said wet washing, puts the container body 11 on the turntable 61 with its opening 11c facing downward; in implementation, said multiple wind knives 62 can include a bottom wind knife 621 and a side wind knife 622, the bottom wind knife 621 runs across the bottom of the turntable 61, the side wind knife 622 is placed on one side of the inner wall of the container body liquid removing chamber 60, and the linear wind provided by the bottom wind knife 621 can blow on the inner surface 11f of the container body 11 through the opening 11c, the linear wind provided by the side wind knife 622 can blow on the outer surface 11f of the container body 11. When the container body 11 receives blowing by the linear wind of the bottom wind knife 621 and the side wind knife 622 respectively at different axial directions and in planar distributions, the turntable 61 can drive the container body 11 to rotate, so that the linear wind provided by the bottom wind knife 621 and the side wind knife 622 can evenly blow on the inner surface 11f and outer surface 11g of the container body 11, thus enhancing the effect of liquid removing for the container body 11. Furthermore, in implementation, said wind knives 62 are connected to a wind pressure supplier 63. The wind pressure supplier 63 is provided with an electric heater (not shown in the figure). The electric heater heats up the high-pressure air provided by the wind pressure supplier 63. In implementation, said container body liquid removing chamber 60 can be provided with a cover board 60a that can be turned open. When the cover board 60a is turned open, the container body liquid removing chamber 60 is communicated to the outside, so that the robot 20 can place the container body 11 needing liquid removing into said container body liquid removing chamber 60, or can capture the container body 11 after completion of liquid removing inside the container body liquid removing chamber 60; on the contrary, when the cover board 60a is closed, the inner space of the container body liquid removing chamber 60 forms a closed space to facilitate the liquid removing process for the container body 11 inside the container body liquid removing chamber 60, while avoiding splattering of the washing liquid out of the container body liquid removing chamber 60 during the liquid removing process for the container body 11.

Figure 16:
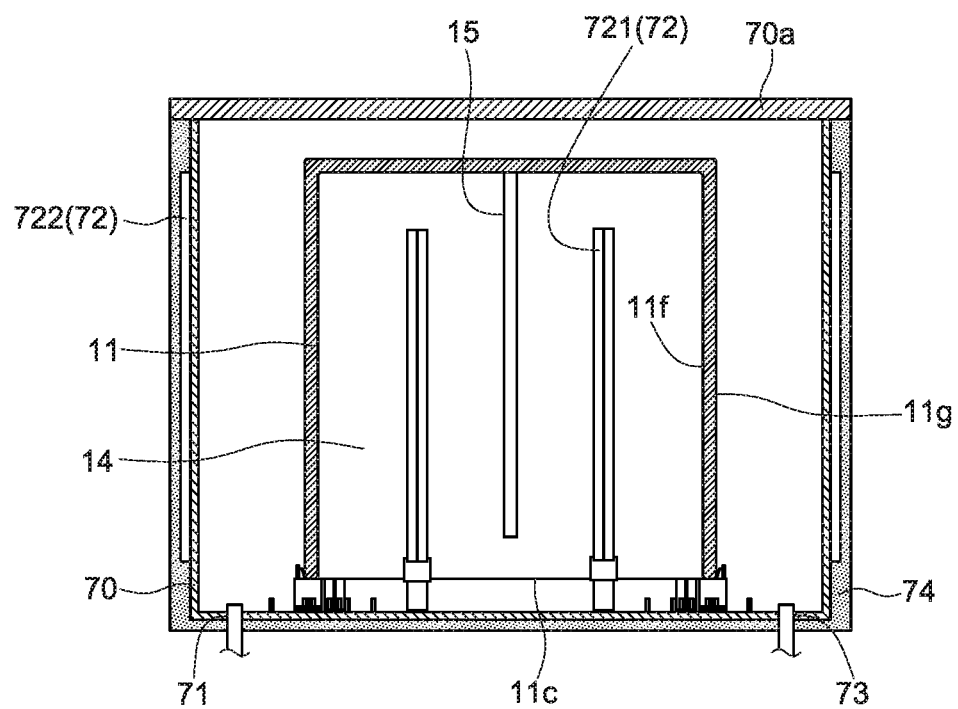
FIG. 16 is a sectional view of the container body vacuum drying chamber in FIG. 13.

Referring jointly to FIG. 13 and FIG. 16, said container body vacuum drying chamber 70 is configured with an exhaust hole 71 and multiple planar thermal components 72, wherein the exhaust hole 71 is used to capture the air inside the container body vacuum drying chamber 70 to generate negative pressure. Said multiple thermal components 72 include multiple built-in vertical electric hot plates 721 and multiple wall-type electric hot plates 722; said vertical electric hot plate 721 is vertically placed in the container body vacuum drying chamber 70. After the container body 11 is placed into the container body vacuum drying chamber 70, the vertical electric hot plate 721 can be planted into the contain chamber 14 of the container body 11, so that the vertical electric hot plates 721 can be planted into the gap between the ribs 13 and suspended support shaft 15 to provide heat radiation; said multiple wall-type electric hot plates 722 are respectively adhered to the peripheral walls of the container body vacuum drying chamber 70, and after the wall-type electric hot plates 722 are adhered to the peripheral walls of the container body vacuum drying chamber 70, its periphery is covered with a heat insulation layer 74 made of heat insulation materials, so that the wall-type electric hot plates 722 are positioned between the peripheral wall of the container body vacuum drying chamber 70 and the heat insulation layer 74. Based on such an embodiment, the heat generated by the vertical electric hot plate 721 can be directly radiated on the peripheral inner surface 11f of the container body 11, and the heat generated by the wall-type electric hot plates 722 can be conducted by the peripheral wall of the container body vacuum drying chamber 70, and be radiated to the peripheral outer surface 11g of the container body 11; specifically, the water molecules possibly remained on the inner surface 11f and outer surface 11g of the container body 11 after liquid removing (i.e., after removing the liquid beads) can be evaporated under thorough heat radiation during the vacuum drying process, thus realizing ideal drying effect.

After the robot 20 captures the container body 11 that has completed the liquid removing process inside said container body liquid removing chamber 60, and places the container body 11 on the bottom of said container body vacuum drying chamber 70 with its opening 11c facing downward, the vertical electric hot plate 721 can extend through the opening 11c into the container body 11 without any touching, to carry vacuum drying for the inner surface 11f of the container body 11 in a close distance, and said wall-type electric hot plate 722 can carry out vacuum drying for the outer surface 11f of the container body 11 in a close distance. In implementation, said container body vacuum drying chamber 70 is provided with a cover board 70a that can be turned open. When the cover board 70a is turned open, said container body vacuum drying chamber 70 is communicated to the outside, so that the robot 20 can place the container body 11 needing vacuum drying into the container body vacuum drying chamber 70, or capture the container body 11 that has completed vacuum drying inside the container body vacuum drying chamber 70; on the contrary, when the cover board 70a is closed, the inner space of the container body vacuum drying chamber 70 forms a closed space to facilitate the vacuum drying process of the container body 11 inside the container body vacuum drying chamber 70.

Figure 1:
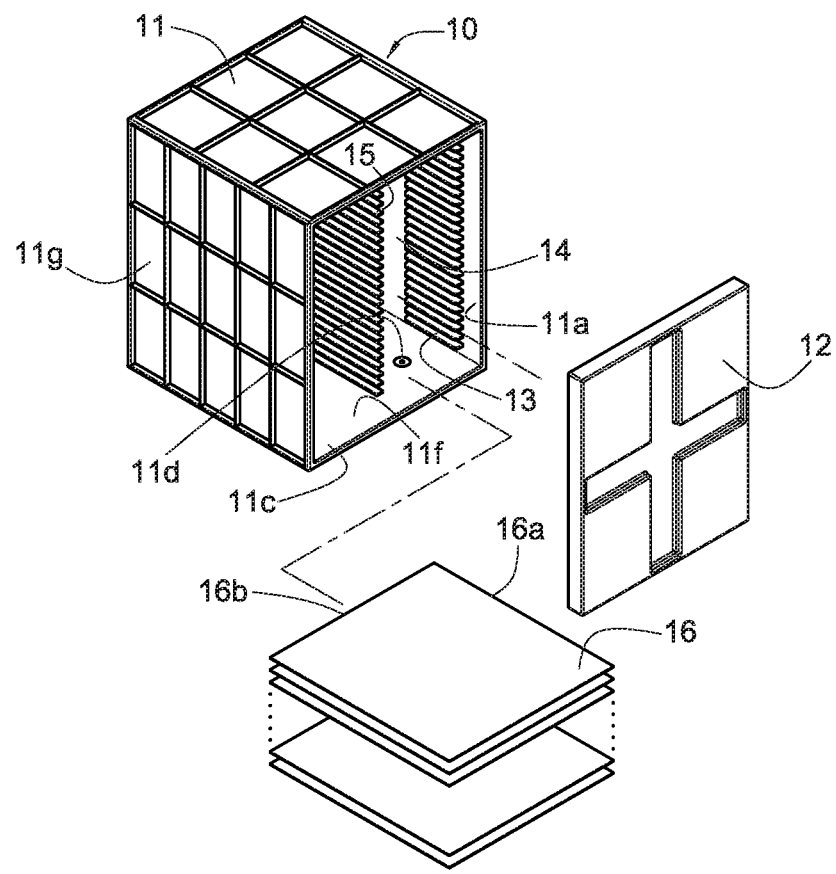
FIG. 1 is an exploded perspective view of the object FOUP.
Figure 2:
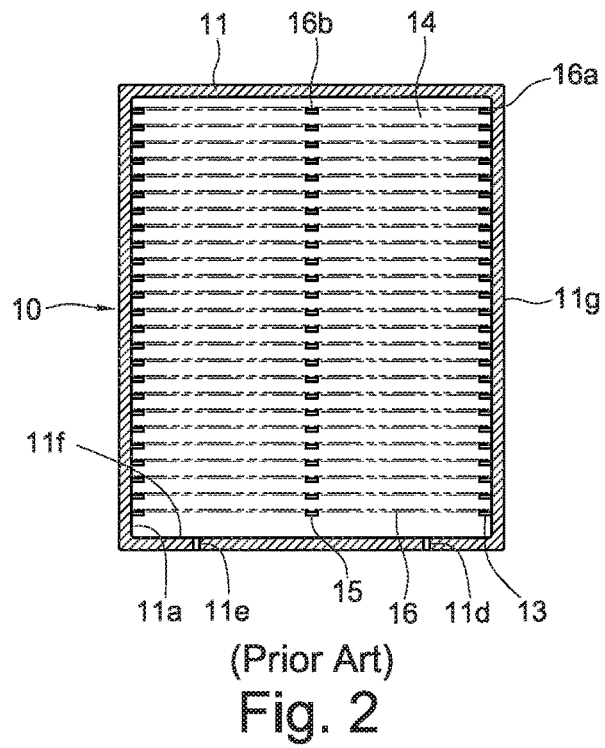
FIG. 2 and FIG. 3 are sectional views of the object FOUP seen from different angles.
Figure 3:
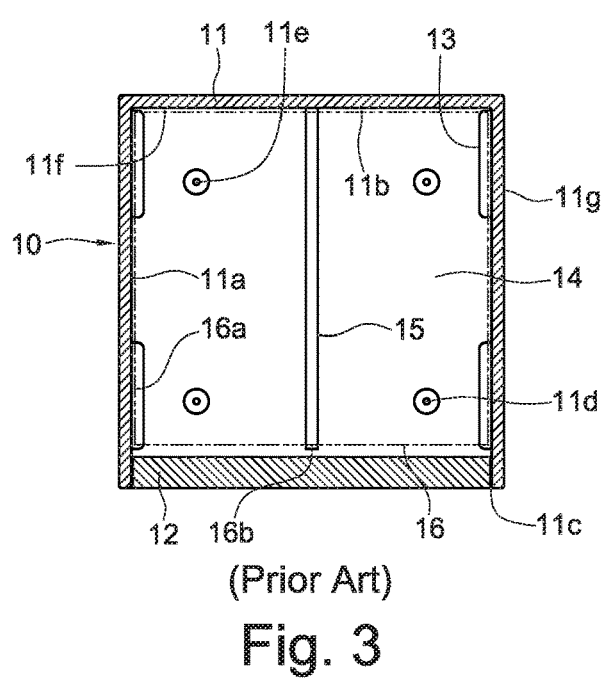

Referring jointly to FIG. 3, FIG. 13 and FIG. 14, the first embodiment of the related structure applied to implement the humidity detecting process is disclosed; wherein, as disclosed in FIG. 3, on the bottom of the container body 11 of the object FOUP 10, there are multiple first interfaces 11d for filling air into the object FOUP 10, and multiple second interfaces 11e to discharge the air, and the first interfaces 11d and the second interfaces 11e are respectively configured with a non-return feature, so that air can only go in one direction from the first interface 11d into the object FOUP 10, and go in one direction from the second interface 11e out of the object FOUP 10; In addition, as disclosed in FIG. 13 and FIG. 14, the platform 31 of the load port 30 is configured with an inlet nozzle 34 and an air discharge nozzle 35, wherein, when the object FOUP 10 is placed and positioned on the platform 31, the air inlet nozzle 34 can be inserted and communicated to the first interface 11d, and the air discharge nozzle 35 can be inserted to communicate to the second interface 11e. Based on such structural installations, the innovation of the present invention is to use the air inlet nozzle 34 to introduce clean positive-pressure dry air into the object FOUP 10 through the first interface 11d, and makes it possible for the positive-pressure dry air inside the object FOUP 10 to be discharged from the second interface 11e and the air discharge nozzle 35 and be collected, so as to detect if the humidity and dust level inside the object FOUP 10 after cleaning can meet the standard of cleanness. For this purpose, the present invention specifically connects the air discharge nozzle 35 to a multi-pass tube 80, meanwhile connects the multi-pass tube 80 to a humidity sensor 81 (see FIG. 11), so that the humidity sensor 81 can detect the humidity of the positive-pressure dry air discharged from the object FOUP 10. Furthermore, the present invention can also use the multi-pass tube 80 to be connected to a particle counter 82, so that the particle counter 82 can detect the amount of dust in the positive-pressure dry air discharged from the object FOUP 10. Specifically, it is to be noted that, after clean dry air is introduced from the air inlet nozzle 34 to the cleaned object FOUP 10, the air discharge nozzle 35 is in a closed state, so that the dry air inside the object FOUP 10 can generate air flow of positive pressure (i.e., higher than 1 atm) capture water or dust residues on the inner surfaces of the object FOUP 10 (including inner surfaces of the container body and the container lid); then, the air discharge nozzle 35 is opened, so that the positive-pressure dry air inside the object FOUP 10 can maintain a certain period of discharge through the multi-pass tube 80, and the discharged positive-pressure dry air is sampled to detect the humidity and the amount of dust; During the continuous discharge of the positive-pressure dry air, the air inlet nozzle 34 is kept open, so that the dry air inside the object FOUP 10 can maintain continuous outflow under positive pressure, so as to enhance the efficiency for the dry air to capture water molecules and dust particles. Moreover, the present invention can also connect a negative pressure generator to the multi-pass tube 80, so as to quickly capture the positive-pressure dry air inside the object FOUP 10 to go through the multi-pass tube 80 into the humidity sensor 81 and the particle counter 82, so as to enhance the speed of humidity and dust particle detection.

Referring jointly to FIG. 13 and FIG. 16, a second embodiment of the related structure applied for the humidity detecting process is disclosed; wherein, as disclosed in FIG. 16, except the exhaust hole 71 to introduce negative pressure to generate vacuum pressure, said container body vacuum drying chamber 70 is also provided with an air inlet 73 to introduce clean dry air; specifically, the exhaust hole 71 is used to connect to the multi-pass tube 80, and the negative pressure generator (such as an air suction pump) can be connected to one of the multiple interfaces of the multi-pass tube 80, so as to capture the air inside the container body vacuum drying chamber 70 through the exhaust hole 71 to generate said vacuum pressure; moreover, as shown in FIG. 12, another interface among the multiple interfaces of the multi-pass tube 80 can be connected to the humidity sensor 81, and another interface among the multiple interfaces of the multi-pass tube 80 can be connected to the particle counter 82. Based on such structural installations, the present invention can, after completion of the vacuum drying process of the container body 11 inside the container body vacuum drying chamber 70 under the vacuum pressure maintained, use the air inlet 73 to introduce clean dry air into the container body vacuum drying chamber 70 to release the vacuum condition, and generate positive-pressure dry air inside the container body vacuum drying chamber 70, so that positive-pressure dry air can be discharged from the exhaust hole 71 to the multi-pass tube 80. Thus, the humidity sensor 81 can detect the humidity of the positive-pressure dry air discharged from the object FOUP 10, and meanwhile, the particle counter 82 can detect the amount of dust in the positive-pressure dry air. Specifically, it is to be noted that, the exhaust hole 71 and the air inlet 73 are respectively configured with automatic valves (such as solenoid valves); wherein, the automatic valve of the exhaust hole 71 can control when to let the negative pressure air to be discharged from the exhaust hole 71 out of the container body vacuum drying chamber 70, and the automatic valve of the air inlet 73 can control when to let dry air flow through the air inlet 73 into the container body vacuum drying chamber 70 to generate positive pressure. More specifically, after the exhaust hole 71 captures the air inside the container body vacuum drying chamber 70 to generate vacuum pressure, the air inlet 73 is in a closed state to facilitate generation of vacuum pressure; and when the air inlet 73 is opened to introduce dry air into the container body vacuum drying chamber 70, the exhaust hole 71 is in a closed state to enable the dry air to generate positive pressure, and to capture the possible water and dust residues on the inner and outer surfaces 11*f*, 11*g* of the container body 11; Then, the exhaust hole 71 is opened to maintain a certain period of discharge of the positive-pressure dry air inside the container body vacuum drying chamber 70 through the multi-pass tube 80, and the discharged positive-pressure dry air is sampled for humidity and dust particle detection; and during the continuous discharge of the positive-pressure dry air, the air inlet 73 is maintain in the open state, so that the dry air inside the container body vacuum drying chamber 70 can maintain a positive-pressure outflow to enhance the efficiency for the dry air to capture the water molecules and dust particles.

Although the invention has been explained in relation to its preferred embodiment, it is to be understood that many other possible modifications and variations can be made without departing from the spirit and scope of the invention as hereinafter claimed.

The invention claimed is:

1. A method for cleaning a FOUP (Front Opening Unified Pod), implemented in a cleaning processing zone station, said cleaning method comprising the steps of:

separating the FOUP into a container lid and a container body, so that the container body has an opening, then sequentially carrying out a wet washing process, a liquid removing process and a vacuum drying process for the container lid and the container body, and finally combining the container lid and the container body, wherein, said wet washing process, said liquid removing process, and said vacuum drying process for the container body are respectively carried out in multiple different chambers, said multiple different chambers are distributed around the cleaning processing zone station, including:

at least one container body washing chamber for wet washing, at least one container body liquid removing chamber for liquid removing, and at least one container body vacuum drying chamber for vacuum drying, wherein the container body is in a rotary mode to receive liquid removing inside said container body liquid removing chamber, and inside said container body liquid removing chamber, multiple wind knives are used to generate linear wind at different axial directions to conduct liquid removing for inner surfaces and outer surfaces of the container body;

wherein inside said container body vacuum drying chamber, multiple thermal components are used to conduct vacuum drying after liquid removing for the inner surfaces and outer surfaces of the container body in a vacuum environment;

wherein a load port is distributed around said cleaning processing zone station, the load port is used for placement of the FOUP before separation of the container lid and the container body, the load port also provides a process to move the FOUP, the moving process includes turning a direction of the FOUP; and a humidity detecting process, wherein the humidity detecting process is carried out after combination of the container lid and the container body, including:

the load port introducing clean dry air into the FOUP to generate a positive-pressure dry air, the load port provides a multi-pass tube, to capture the positive-pressure dry air, and the multi-pass tube provides a humidity sensor, to detect humidity of the positive-pressure dry air.

2. The method as recited in claim 1, wherein said multi-pass tube also provides a particle counter, to detect an amount of dust in the positive-pressure dry air.

3. The method as recited in claim 1, wherein a bottom of said container body is protruded with at least one suspended support shaft, and one of the inner surfaces of the container body includes a peripheral surface of the suspended support shaft.

4. A method for cleaning a FOUP (Front Opening Unified Pod), implemented in a cleaning processing zone station, said cleaning method comprising the steps of:

separating the FOUP into a container lid and a container body, so that the container body has an opening, then sequentially carrying out a wet washing process, a liquid removing process and a vacuum drying process for the container lid and the container body, and finally combining the container lid and the container body, wherein, said wet washing process, said liquid removing process, and said drying process for the container body are respectively carried out in multiple different chambers, said multiple different chambers are distributed around the cleaning processing zone station, including:

at least one container body washing chamber for wet washing, at least one container body liquid removing chamber for liquid removing, and at least one container body vacuum drying chamber for vacuum drying, wherein the container body is in a rotary mode to receive liquid removing inside said container body liquid removing chamber, and inside said container body liquid removing chamber, multiple wind knives are used to generate linear wind at different axial directions to conduct liquid removing for inner surfaces and outer surfaces of the container body;

wherein inside said container body vacuum drying chamber, multiple thermal components are used to conduct vacuum drying after liquid removing for the inner surfaces and outer surfaces of the container body in a vacuum environment; and a humidity detecting process, wherein the humidity detecting process is carried out in the vacuum drying process, including:

after completion of the vacuum drying process for the container body inside said container body vacuum drying chamber, dry air is introduced into said container body vacuum drying chamber to release a vacuum condition, then a positive-pressure dry air is generated inside said container body vacuum drying chamber, said container body vacuum drying chamber also provides a multi-pass tube, to capture the positive-pressure dry air, and the multi-pass tube provides a humidity sensor, to detect humidity of the positive-pressure dry air.

5. The method as recited in claim 4, wherein said multi-pass tube also provides a particle counter, used to detect an amount of dust in the positive-pressure dry air.

6. The method as recited in claim 4, wherein a bottom of said container body is protruded with at least one suspended support shaft, and one of the inner surfaces of the container body includes a peripheral surface of the suspended support shaft.

* * * * *